(12) United States Patent
Ulriksson et al.

(10) Patent No.: US 11,996,862 B2
(45) Date of Patent: May 28, 2024

(54) HIGH PERFORMANCE DECODER

(71) Applicant: Seagate Technology LLC, Fremont, CA (US)

(72) Inventors: Bengt Anders Ulriksson, Longmont, CO (US); Ara Patapoutian, Shrewsbury, MA (US)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 17/930,310

(22) Filed: Sep. 7, 2022

(65) Prior Publication Data

US 2024/0080043 A1 Mar. 7, 2024

(51) Int. Cl.
*H03M 13/11* (2006.01)
*G06F 9/54* (2006.01)
*H03M 13/00* (2006.01)

(52) U.S. Cl.
CPC ......... *H03M 13/1111* (2013.01); *G06F 9/546* (2013.01); *H03M 13/611* (2013.01)

(58) Field of Classification Search
CPC ... H03M 13/1111; H03M 13/611; G06F 9/546
See application file for complete search history.

(56) References Cited

U.S. PATENT DOCUMENTS

| | | |
|---|---|---|
| 8,504,887 B1 | 8/2013 | Varnica et al. |
| 8,984,365 B1 | 3/2015 | Norrie |
| 9,015,547 B2 | 4/2015 | Wang et al. |
| 9,141,467 B2 | 9/2015 | Kim et al. |
| 9,176,814 B2 | 11/2015 | Cherubini et al. |
| 9,337,865 B2 | 5/2016 | Cohen et al. |
| 2005/0283707 A1* | 12/2005 | Sharon ............... H03M 13/1137 714/758 |
| 2015/0236726 A1 | 8/2015 | Sankaranarayanan et al. |
| 2018/0167086 A1* | 6/2018 | Tai ..................... H03M 13/658 |
| 2020/0373943 A1 | 11/2020 | Cho et al. |

FOREIGN PATENT DOCUMENTS

CN 104579362 B 10/2017

* cited by examiner

*Primary Examiner* — Thien Nguyen

(57) ABSTRACT

Systems and methods are disclosed for implementing a high performance decoder. In certain embodiments, an apparatus may comprise a decoder circuit configured to decode a codeword of bits, including: a check node processor configured to provide a plurality of check to variable (c2v) messages to a variable node processor in parallel, the plurality of c2v messages including log likelihood ratio (LLR) data related a parity sum of multiple bits of the codeword; the variable node processor configured to generate a decision vector based on the plurality of c2v messages; and a convergence checker circuit configured to determine whether the codeword has been decoded based on the decision vector and output decoded data when the codeword has been decoded.

20 Claims, 8 Drawing Sheets

HIGH PERFORMANCE DECODER

SUMMARY

In certain embodiments, an apparatus may comprise a decoder circuit configured to decode a codeword of bits, including: a check node processor configured to provide a plurality of check to variable (c2v) message vectors to a variable node processor in parallel, each of the plurality of c2v message vectors including log likelihood ratio (LLR) data related a parity sum of multiple bits of the codeword; the variable node processor configured to generate a decision vector based on the plurality of c2v message vectors; and a convergence checker circuit configured to determine whether the codeword has been decoded based on the decision vector and output decoded data when the codeword has been decoded.

In certain embodiments, a method may comprise decoding a codeword of bits via a decoder circuit, including: providing a plurality of check to variable (c2v) messages from a check node processor to a variable node processor in parallel, the plurality of c2v messages including log likelihood ratio (LLR) data related a parity sum of multiple bits of the codeword; generating a decision vector based on the plurality of c2v messages; determining whether the codeword has been decoded based on the decision vector; and outputting decoded data when the codeword has been decoded.

In certain embodiments, a memory device may store instructions that, when executed, cause a processor to perform a method comprising decoding a codeword of bits via a decoder circuit, including: providing a plurality of check to variable (c2v) message vectors from a check node processor to a variable node processor in parallel, each of the plurality of c2v message vectors including log likelihood ratio (LLR) data related a parity sum of multiple bits of the codeword; generating a decision vector based on the plurality of c2v message vectors; determining whether the codeword has been decoded based on the decision vector; and outputting decoded data when the codeword has been decoded.

DETAILED DESCRIPTION

In the following detailed description of certain embodiments, reference is made to the accompanying drawings which form a part hereof, and in which are shown by way of illustration of example embodiments. It is also to be understood that features of the embodiments and examples herein can be combined, exchanged, or removed, other embodiments may be utilized or created, and structural changes may be made without departing from the scope of the present disclosure.

In accordance with various embodiments, the methods and functions described herein may be implemented as one or more software programs running on a computer processor or controller. Dedicated hardware implementations including, but not limited to, application specific integrated circuits, programmable logic arrays, and other hardware devices can likewise be constructed to implement the methods and functions described herein. Methods and functions may be performed by modules or nodes, which may include one or more physical components of a computing device (e.g., logic, circuits, processors, etc.) configured to perform a particular task or job, or may include instructions that, when executed, can cause a processor to perform a particular task or job, or any combination thereof. Further, the methods described herein may be implemented as a computer readable storage medium or memory device including instructions that, when executed, cause a processor to perform the methods.

Figure 1:
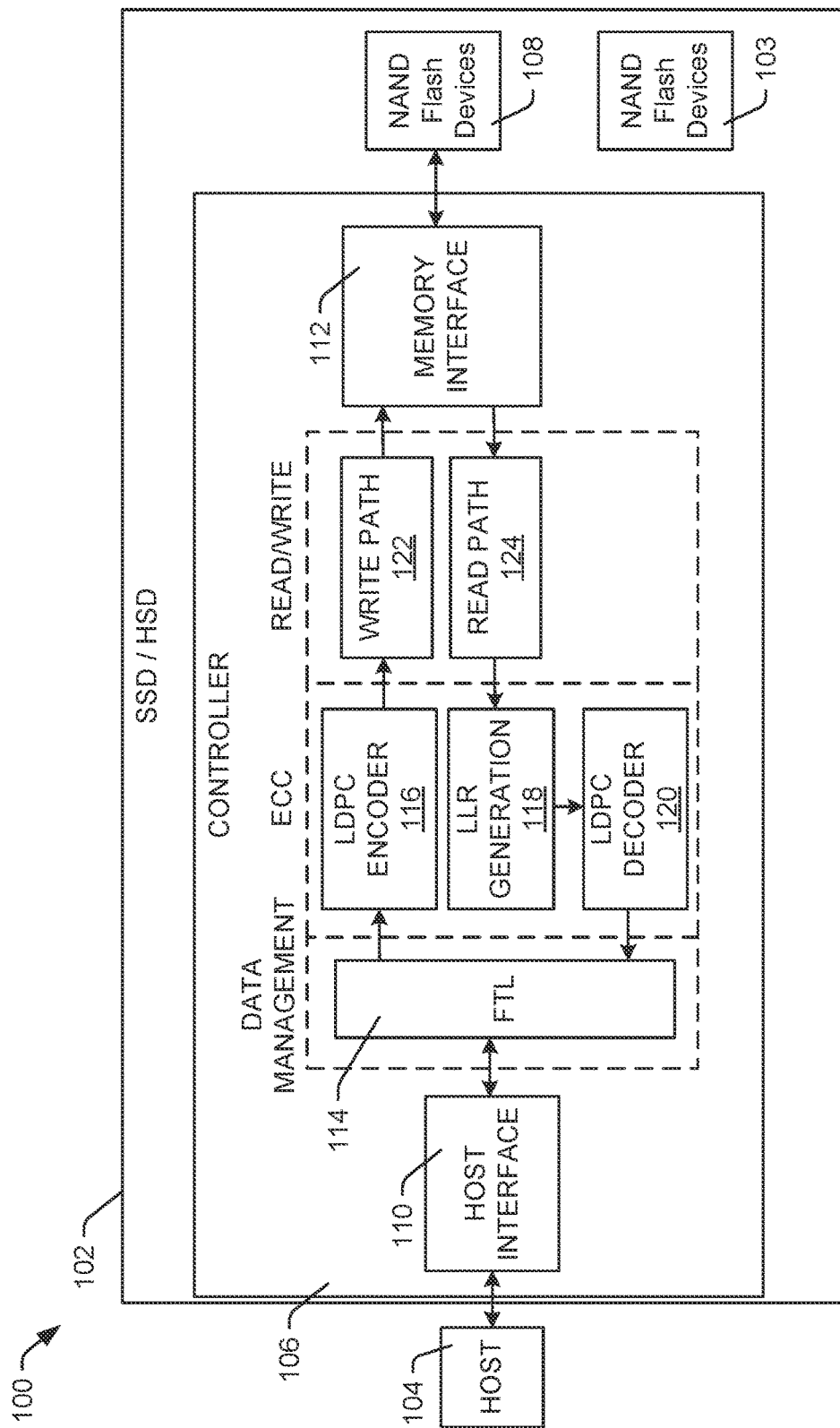
FIG. 1 is a diagram of a system configured to implement a high performance decoder, in accordance with certain embodiments of the present disclosure.

FIG. 1 is a diagram of a system 100 configured to implement a high performance decoder, in accordance with certain embodiments of the present disclosure. Although the systems and methods of decoding described herein can be applied to any appropriate data transmission and decoding process, examples will be provided herein of applying the decoding to data storage and retrieval. Specifically, FIG. 1 provides a functional block diagram of an example data storage device (DSD) 102 and host 104. The DSD 102 may be a solid state data storage device (SSD) or a hybrid data storage device (HSD) or any other type of data storage device for which the present systems and processes may be beneficial.

The DSD 102 can include one or more data storage mediums, such as one or more solid state memories 108, for example NAND flash memory. The DSD 102 may include one or more additional memories 103 instead of or in addition to flash memory 108. For example, additional memory 103 can be either volatile memory such as DRAM or SRAM, disc-based nonvolatile memories such as magnetic hard discs, other types of memory, or a combination thereof. The additional memory 103 can function as a working memory for software or firmware, storing generated parity data, a cache to store recently or frequently read or written data, or data likely to be read soon, or for other temporary data storage. Additional memory 103 may also function as main long-term storage instead of or in addition to flash memory 108. A DSD 102 containing multiple types of nonvolatile storage mediums, such as a disc(s) and flash, may be referred to as a hybrid storage device.

The DSD 102 can communicate with a host device 104 via a hardware and firmware-based interface circuit 110. The interface 104 may comprise any interface that allows communication between the host 104 and the DSD 102, via either wired or wireless connection, such as Universal Serial Bus (USB), IEEE 1394 (Institute of Electrical and Electronics Engineers standard 1394), Compact Flash, Serial AT Attachment (SATA), external SATA (eSATA), Parallel ATA (PATA), Small Computer System Interface (SCSI), Serial Attached SCSI (SAS), Peripheral Component Interconnect Express (PCIe), Fibre Channel, Ethernet, or Thunderbolt, among others. The host interface 110 may include a connector (not shown) that allows the DSD 102 to be physically removed from the host 104. In some embodiments, the DSD 102 may have a casing or housing containing the components of the DSD 102, or the components of the DSD 102 may be attached to the housing, or a combination thereof.

The DSD 102 can include a programmable controller 106, which can include various circuits, modules, and functions that allow the controller to perform data management, error correcting code (ECC), and read/write processes. The controller 106 may also include a memory interface 112 that allows data to be stored to and read from the solid state memory 108. The controller 106 may also include a flash translation layer (FTL) 114 to map sectors and pages from logical addresses to physical addresses, which may be implemented via tables.

The controller 106 may also perform data detection and associated error correction via utilizing error correcting code (ECC), which may be implemented via one or more circuits, firmware, or a combination thereof. The error correction may include a low density parity check (LDPC) encoder 116, a log-likelihood ratio (LLR) generator 118, and a LDPC decoder 120. The LDPC encoder 116 can encode data bits based on a specific LDPC code to store data at the solid state memory 108 via a write path 122 and the memory interface 112. LDPC codes may vary based on SSD endurance requirements or other memory design requirements. The LDPC decoder 120 can decode data from the solid state memory 108 based on the LDPC code of the encoder 116; the LDPC decoder may receive soft information as an input from the LLR generator 118 which can determine the information based on bits received from the read path 124.

The LLR generator 118 can provide a soft estimation for the data bits of the memory cells of a memory sector of the memory 108. The LLR generation module 118 can provide the information in the form of log-likelihood ratios (LLRs), which is a probability of each data bit being 0 or 1. The LLRs are indicative of a confidence in zero ("0") or one ("1") for each data bit read from the memory 108. Generally, a sign of the LLR can provide an estimation of the data bit, and a magnitude of the LLR can provide a reliability of the estimation. For example, the larger a positive LLR value is, the stronger the confidence that a bit is a "0"; the larger a negative LLR value is, the stronger the confidence that a bit is a "1" (or vice-versa, depending on implementation); and the lower the value, the greater the uncertainty.

As an example, during re-reads of solid state memories like NAND flash 108, the DSD 102 may apply a variety of different read voltage thresholds, and can evaluate how the read bit values change using the different thresholds. This can generate "soft" information which can provide additional insights into which bits are most reliable. For example, if adjusting the read thresholds up and down produces no change in a given bit value, then the bit is likely to be stable and correct. If adjusting the read threshold changes the bit value, then the bit value may be less "reliable". The additional soft information can be used with LLR lookup tables (LUTs) or algorithms to assign different LLRs to the 0's and 1's. Based on the estimated LLRs for the data bits, the decoder module 120 can decode the data.

An LDPC code word can consist of both user and parity data. Parity data may be calculated by encoder 116 such that a large number of parity sums are satisfied, e.g., sums of bits modulus 2 are either 0 (even parity) or 1 (odd parity). The decoder 120 can correct errors in a corrupted code word until all parity sums are satisfied.

Competitive data storage devices may require very high data rates, and accordingly the speed of the decoder 120 can greatly affect a drive's performance. Improving decoder performance at the cost of high power consumption or complexity can have disadvantages in cost, battery life, component size, or other considerations. Accordingly, providing a "one shot" decoder with low complexity and high parallelism to improve performance and minimize power requirements can improve data detection operations and systems. The functioning of example LDPC decoders is illustrated in the following figures.

Figure 2:
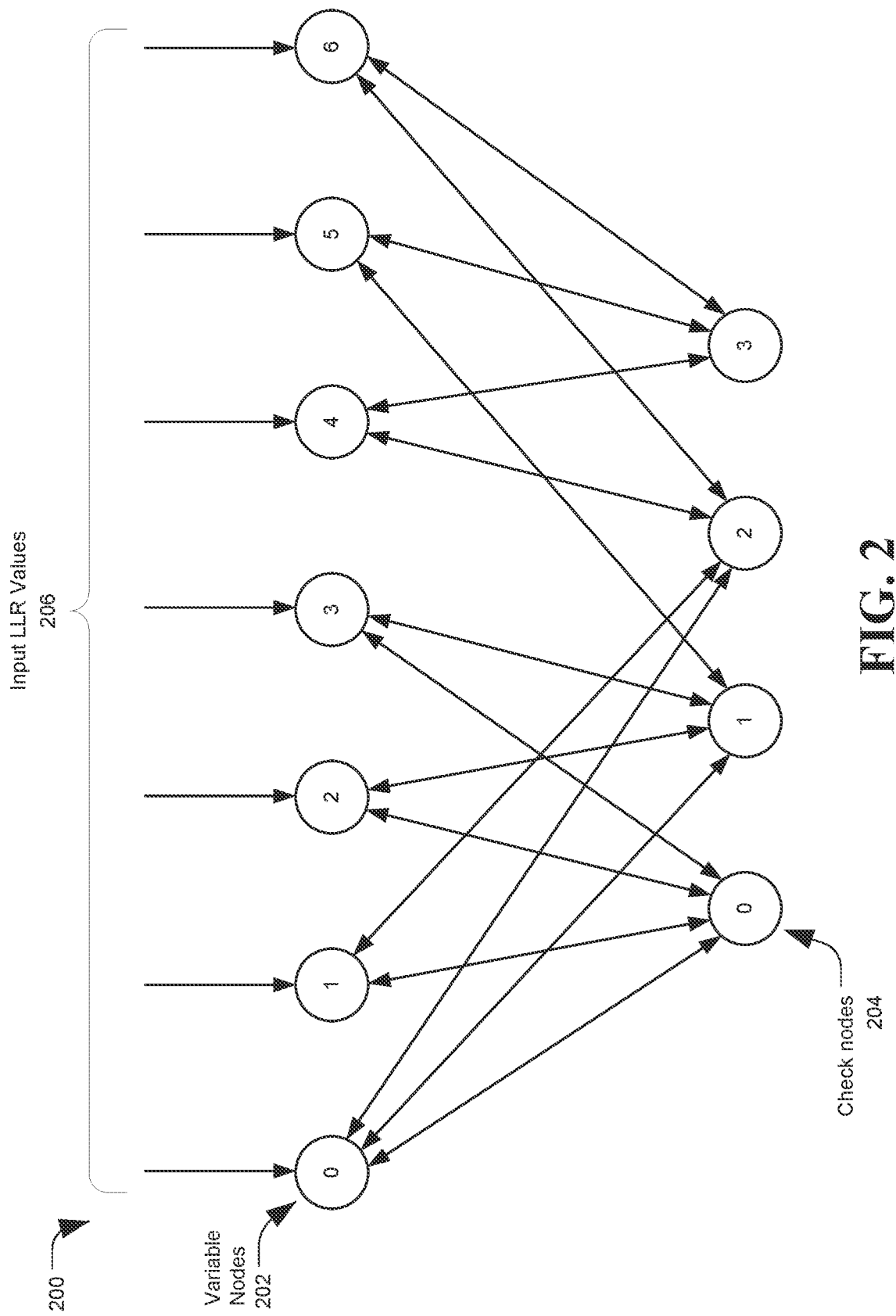
FIG. 2 is a diagram of a system configured to implement a high performance decoder, in accordance with certain embodiments of the present disclosure.

FIG. 2 is a diagram of a system 200 configured to implement a high performance decoder, in accordance with certain embodiments of the present disclosure. In particular, FIG. 2 depicts an example Tanner graph for low density parity check (LDPC) code. The graph may include a plurality of variable nodes 202 (labeled 0 to 6), sometimes called v-nodes, connected to a plurality of check nodes 204 (labeled 0 to 3), sometimes called c-nodes, constraints, or constraint nodes. The variable nodes 202 may receive input LLR values 206 for an LDPC code word, for example from an LLR generation module 118 of FIG. 1. The number of v-nodes 202 may correspond to the length (e.g., number of bits) of a code word to be decoded. Meanwhile, the number of c-nodes 204 may correspond to how many "constraints" or "parities" are being used to detect or correct errors in a code word, as explained below.

A soft, iterative LDPC decoder can provide a very good compromise between complexity and performance. A soft decoder uses reliability information to improve performance, for example in the form of log-likelihood ratios (LLRs). An iterative decoder can exchange soft information between variable nodes 202 and check nodes 204 using a number of iterations until convergence, where all parity sums are satisfied. Reducing a required number of iterations, increasing an amount of data exchanged during an iteration, and increasing the code word size are potential ways of improving decoder performance. FIG. 2 shows a Tanner Graph which provides an illustration of the connections between variable nodes 202 and check nodes 204.

The LLR values 206 for an LDPC code word may be populated into the variable nodes 202. LLR values may be provided from variable nodes 202 to check nodes 204 along the connecting arrows. Each check node 204 can estimate the value and reliability of a given bit from the information about all other bits that participate in a given parity sum. The estimated bit values for each bit received by a given check node 204 should sum, modulo two, to zero for the parity sum to be considered valid. That is, in an even parity system, all values connecting to a check node 204 should sum to an even number; or there must be an even number of odd values. Each check node 204 for an LDPC code word may need to output a 0 parity sum value for the code word to be considered successfully decoded. If each bit is represented by a log-likelihood ratio, then the log-likelihood ratio of a given bit can be calculated by the belief propagation expression:

$$c2v_i = 2\tanh^{-1}\left(\prod_{\substack{0 \leq k < n \\ k \neq i}} \tanh(v2c_k/2)\right) \quad (1)$$

where $v2c_k$ are messages sent from variable node 202 to check node 204, and $c2v_k$ are messages sent from check node 204 to variable node 202, both expressed as log-likelihood ratios. The v2c and c2v messages may be vectors, each providing LLR values for a plurality of bits (e.g., 512 bits) of a variable node vector or check node vector.

Equation 1 may not be used in a practical decoder due to both complexity and sensitivity to rounding errors. Instead, the min-sum approximation is commonly used in practical check nodes:

$$\text{sign}(c2v_i) = \sum_{\substack{0 \le k < n \\ k \ne i}} \text{sign}(v2c_k) \bmod 2 \quad (2)$$

$$|c2v_i| = \min_{\substack{0 \le k < n \\ k \ne i}} (|v2c_k|) \quad (3)$$

where sign(x) is 1 if x<0, 0 otherwise. The check node 204 can retain a state which enables it to calculate c2v messages for all bits involved in a particular parity sum. The state may consist of the total sign sum (sum of all signs of incoming messages modulus 2), $\min_1$ (the magnitude of the least reliable input message), $eix_1$ (the edge index of the least reliable message) and mine (the magnitude of the second least reliable message) and finally, a sign memory containing the sign information for all incoming v2c messages.

The variable node 202 may combine all available information about a given bit in the code word. This includes the input log-likelihood ratio 206 provided by a detector or LLR generation module, and messages from all check nodes 204 in which a given bit is involved. On an initial iteration, the information from a check node 204 may be a null value or another nonce value that does not influence the estimate of the bit's value. If this total information combined at the variable node 202 is represented by LLRs, the total information (sometimes called posterior information) is given by a simple sum:

$$\text{Posterior}_i = LLR_i^{in} + \sum_{0 \le k < n} c2v_k \quad (4)$$

The decoder decision can be determined based on the sign bit of the posterior information.

The return message from the variable node 202 to the check node 204 can be found by a similar expression:

$$v2c_j = LLR_i^{in} + \sum_{\substack{0 \le k < n \\ k \ne j}} c2v_k \quad (5)$$

Figure 3:
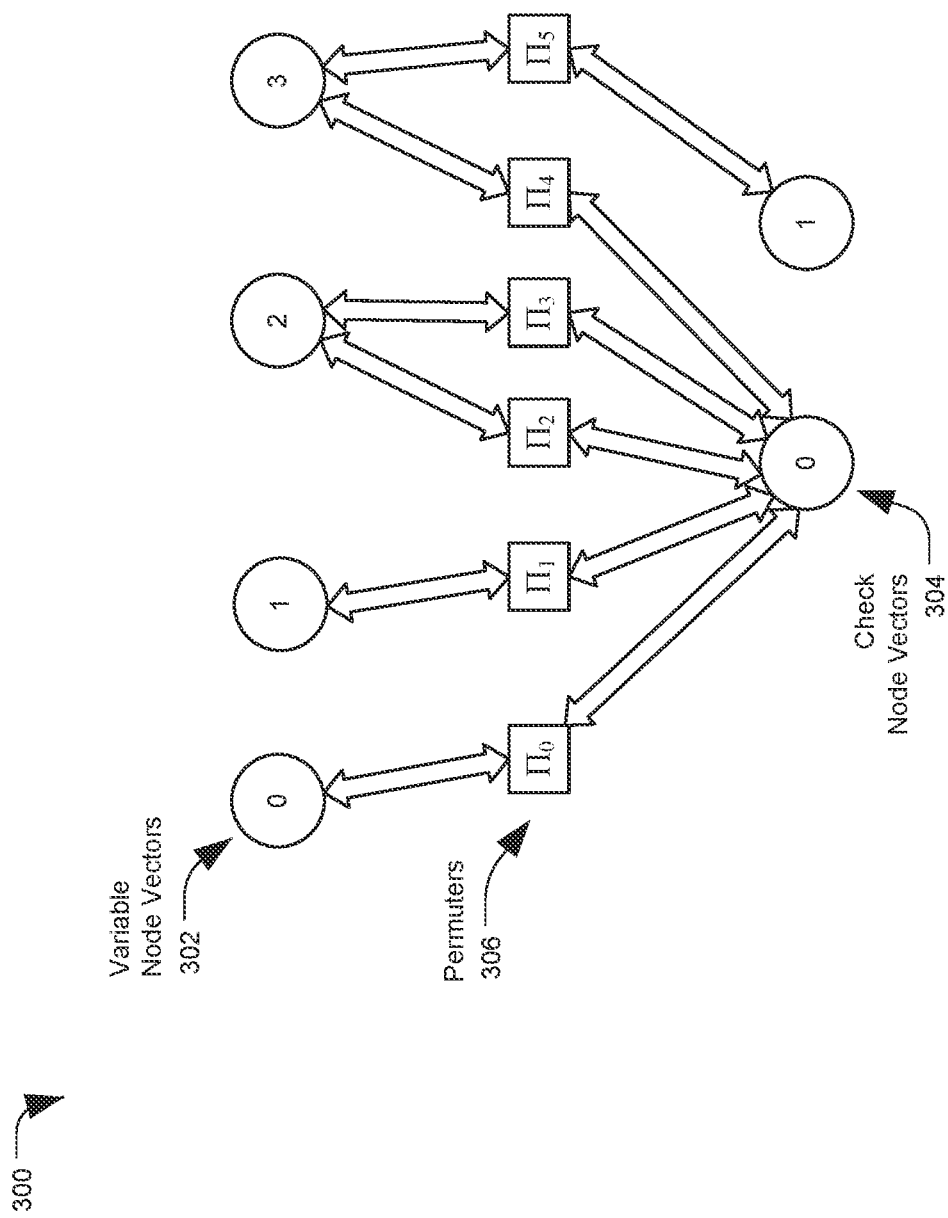
FIG. 3 is a diagram of a system configured to implement a high performance decoder, in accordance with certain embodiments of the present disclosure.

Turning now to FIG. 3, a diagram of a system 300 configured to implement a high performance decoder is shown, in accordance with certain embodiments of the present disclosure. In particular, FIG. 3 depicts an example simplified vector Tanner graph, similar to Tanner graph depicted in FIG. 2.

LDPC detector graphs may be designed such that edges can be processed in parallel using a vector processor. In practical implementation of a decoder, large code words may be decoded with thousands of bits, such as 32K bits. So having 32K individual variable nodes connected to potentially hundreds or thousands of check nodes would result in huge complexity in the decoder. Instead, the variable nodes and check nodes may be grouped into vectors, where, e.g., a node vector may handle 512 bits, so that 32K bits could be handled via 64 v-node vectors. Accordingly, system 300 may include a plurality of variable nodes vectors 302 (labeled 0 to 3), connected to a plurality of check nodes vectors 304 (labeled 0 to 1).

The node vectors may exchange message vectors to handle the large number of bits in parallel. For example, rather than exchanging messages about individual bits between nodes, vector messages can be exchanged between check node vectors 304 and variable node vectors 302 that correspond to "Z" bits of the code word (e.g., 512 bits). Each message vector may have Z individual messages corresponding to the Z code word bits. In a "soft" decoder implementation, the individual message components for each bit of the code word may be represented by an LLR value, where the sign bit is an estimate of the bit decision and the magnitude indicate the reliability of that estimate. This may be true of both the input symbols and the information ("messages") passed between the check nodes 304 and the variable nodes 302.

In the vector implementation, it may be advantageous to have "randomness" or change in the LLR messages, by adjusting the position of the individual messages within a message vector. To implement this, the variable and check node vectors may be interconnected through programmable permuters 306, such that a sufficiently "random" or cyclic permutations of the bus connecting the vectors can be obtained. So each permuter 306 located between the check and variable nodes may process the 512 individual messages of a message vector. The sign memory 504 (and associated sign shifter 530), the decision memory 526, and the convergence checker 528, all discussed later in regard to FIGS. 5 and 6, may be the only parts of the example decoder that only uses bits rather than LLR values.

If each bit of a has a corresponding message, all messages may be passed on, but the order of the messages within the vector can be changed in the permuter 306. For example, a cyclic permuter 306 may shift the messages by i positions, where i is programmable, such that input message 0 becomes output message i, input 1 becomes output i+1, . . . , input message 511 becomes output message i−1, etc. A permuter 306 may be implemented as layers of switches which can shift messages by $2^i$ positions (where i may be the layer index) if the layer is activated (if not activated, then the messages may be passed through without a shift). So for example if the variable node vectors 302 and check node vectors 304 represent, e.g., 512 bits each, the first layer can shift message 0 to 1, message 1 to 2, . . . , message 511 to 0. The second layer can shift message 0 to 2, message 1 to 3, . . . , message 511 to 1. Note that this is not the only way a permuter 306 can be implemented; other example embodiments may use a different scheme. The permutations may be different for v2c and c2v messages. If the $v2c_i$ message vector uses permutation $\Pi_i$ then the $c2v_i$ message vector may use permutation $\Pi_i^{-1}$, where the inverse permutation is defined by $\Pi_i^{-1} \cdot \Pi_i = I$, where I is the identity permutation. Permuters 306, as well as the connections between v-node vectors and c-node vectors (e.g., which nodes are connected), may be programmable, for example via a microcode. Therefore, the edges or connections between node vectors, and the permutations within the connections, can be different depending on the programed microcode or other instructions. In some examples, the permutations of the permuters 306 can be selected based on optimization testing performed during a design process for a system, and then stored as microcode for execution during device operation.

FIG. 3 also includes a multi-edge connection between variable node vector 2 and check node vector 0. A multi-edge connection may refer to several edges connecting a given variable node to a given check node. Supporting such multi-edges may be important when using large parallelism for high performance decoders, as the number of check node vectors is small in such configurations.

Another important consideration in allowing multi-edges in the graph may be the efficiency of the LDPC encoder algorithm. The encoder can solve a linear equation system in the binary field. An efficient algorithm may be obtained by including as many rows as possible in an upper triangular matrix. Equation 6 shows a hypothetical parity check matrix suitable for a decoder that does not support multi-edge connections. Each entry in the matrix may represent a Z by Z matrix. Multiplication of this matrix and a bit vector can permute the bit vector in the same manner as the permutations shown in the Tanner graph. The upper triangular submatrix may not include the 3 last rows of the matrix, requiring substantial effort in the encoder.

$$\begin{matrix} \Pi_{00} & \Pi_{01} & \Pi_{02} & \Pi_{03} & \Pi_{04} & \Pi_{05} & \cdots \\ & \Pi_{11} & \Pi_{12} & \Pi_{13} & & & \cdots \\ & & \ddots & & & & \vdots \\ \Pi_{m-3,0} & \Pi_{m-3,1} & & \Pi_{m-3,3} & \Pi_{m-3,4} & \Pi_{m-3,5} & \cdots \\ \Pi_{m-2,0} & & \Pi_{m-2,2} & \Pi_{m-2,3} & \Pi_{m-2,4} & \Pi_{m-2,5} & \cdots \\ \Pi_{m-1,0} & \Pi_{m-1,1} & \Pi_{m-1,2} & & \Pi_{m-1,4} & \Pi_{m-1,5} & \cdots \end{matrix} \quad (6)$$

Equation 7 shows a hypothetical parity check matrix with degree-4 variable nodes for a decoder which supports multi-edge connections. In this case, there is only one row outside the upper triangular submatrix. An equation involving this parity check matrix can be solved with much less effort than the matrix shown in equation 6.

$$\begin{matrix} \Pi_{00} & \Pi_{01}^a+\Pi_{01}^b & \Pi_{02} & \Pi_{03} & \Pi_{04} & \Pi_{05} & \cdots \\ & \Pi_{11} & \Pi_{12} & \Pi_{13} & \Pi_{14} & \Pi_{15} & \cdots \\ & & \Pi_{22} & \Pi_{23} & \Pi_{24} & & \cdots \\ & & & \Pi_{33} & & \Pi_{35} & \cdots \\ & & & & \ddots & \vdots & \\ \Pi_{m-1,0}^a+\Pi_{m-1,0}^b+\Pi_{m-1,0}^c & \Pi_{m-1,1} & \Pi_{m-1,2} & & \Pi_{m-1,4} & \Pi_{m-1,5} & \cdots \end{matrix} \quad (7)$$

A major difference between LDPC decoders can involve the scheduling of edges, which may refer to the order in which edges between nodes or node vectors are processed during an iteration. The selection of a specific schedule may be highly dependent on the type of channel or decoder used in a given system. Some example decoder types may include flooding decoders and layered decoders.

A flooding decoder may process edges in the variable node (or code word) order. Referring to FIG. 2, the edges connecting variable node 0 to check nodes 0, 1, and 2 may be processed first by sending sequential c2v messages from check nodes 0, 1, and 2 to the variable node 0, which calculates the posterior information and v2c return messages to the check nodes. The process may then be repeated for each variable node in turn until all edges in the graph 200 have been processed, completing the iteration. The flooding decoder may rely on two copies of the decoder state: the first copy may contain the complete state from the previous iteration, whereas the second copy can be updated with the new state for use during the following iteration. This type of decoder can provide good performance in an ISI (inter-symbol interference) channel such as in disc drives.

A layered decoder may process edges in the check node order, e.g., all edges connected to check node 0 may be processed before starting on check node 1. In a layered decoder, the message loop can be initialized from an input LLR buffer during the processing of a first layer during the first iteration. This decoder can read (unsaturated) v2c messages for layer m from a message memory. c2v messages from layer m may then be added to the v2 $c_m$ messages, creating posterior information which can be permuted to match the following layer (m+1). A subtractor can use $c2v_{m+1}$ messages from the previous iteration to create new v2 $c_{m+1}$ messages which can be used to update both the message memory and the check node state for layer m+1. Decisions can be obtained from the posterior values after a de-permutation to recover the unpermuted output vectors.

The type of decoder architecture being used can impact whether flooding or layered decoding can be implemented. The flooding decoder may process the whole code word before it updates the state for the next iteration. Whereas a layered decoder can update the state and provide positive feedback to the v-nodes after each check node, potentially enabling a code word to be decoded without a full iteration. A layered decoder can have some benefits in SSD applications, in that it may require fewer full iterations than a flooding decoder. A "one-shot" decoder provides a novel implementation of a layered LDPC decoder, and may provide optimized scheduling for SSD applications. The example architectures provided herein, however, can be implemented as flooding decoders or layered decoders. A high level view is shown in FIG. 4.

Figure 4:
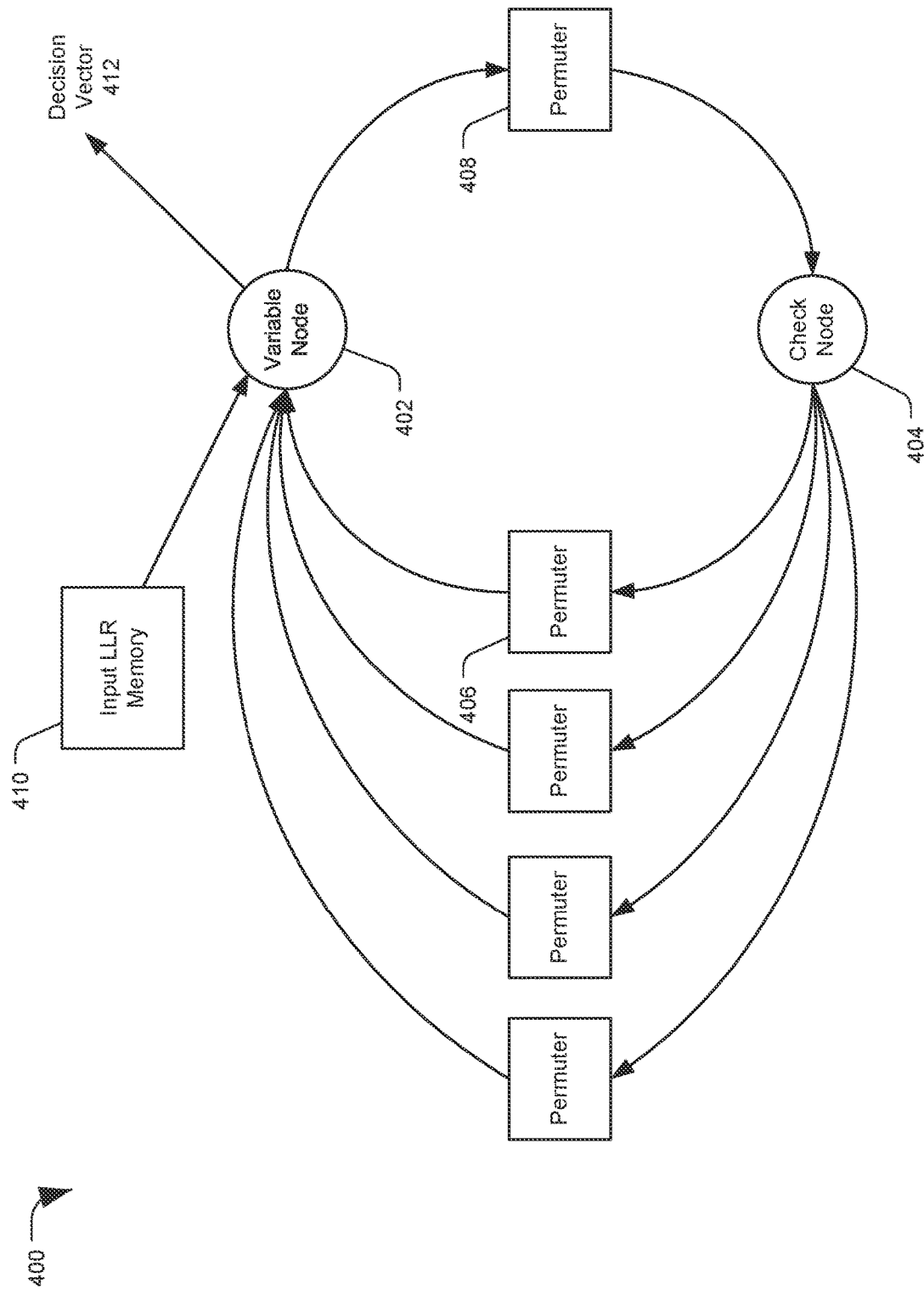
FIG. 4 is a diagram of a system configured to implement a high performance decoder, in accordance with certain embodiments of the present disclosure.

FIG. 4 is a diagram of a system 400 configured to implement a high performance decoder, in accordance with certain embodiments of the present disclosure. In particular, FIG. 4 depicts a high efficiency "one-shot" decoder 400. The decoder 400 may include a variable node processor 402 and a check node processor 404. The node processors may include individual nodes as in FIG. 2, node vectors as in FIG. 3, or sets or groups of nodes or node vectors, and may sometimes be referred to herein as "variable nodes" or "check nodes" for the sake of simplicity. The decoder 400 may further include permuters 406 and 408, an input LLR memory or other LLR source 410, and the decoder 400 may output a decision vector 412.

Whereas an example flooding decoder implementation might use sequential message processing, where the variable node added one message vector to the input LLR values during the first clock cycle followed by accumulating the remaining three c2v message vectors during three clock cycles to generate posterior information, and then generated v2c messages over four clock cycles by subtracting delayed c2v messages from the posterior information, a "one-shot" decoder may significantly accelerate the process. The example "one-shot" decoder 400 may include a variable node 402 that receives input LLR values and all c2v messages in parallel, such that it can calculate both posterior information and a single v2c message vector in one clock cycle. Accordingly, the information to generate posterior information and v2c messages at a variable node may be received in "one shot", rather than spread out over multiple clock cycles.

The example decoder 400 design of FIG. 4 assumes that most variable nodes 402 have degree 4, e.g., four edges connect the variable node 402 to the check nodes 404. The check node processor 404 may generate four messages per clock cycle (e.g., from four different check nodes), such that the variable node processor 402 can calculate both posterior information and the return message to the check node processor 404 in parallel, thus providing high throughput. For example, a single degree 4 variable node 402 may receive c2v messages from four different corresponding check nodes, all processed by check node processor 404. This enables the variable node 402 to generate posterior information in a single clock cycle, rather than receiving one c2v message per clock cycle and requiring four clock cycles to receive the information necessary to generate the posterior information. Similarly, multiple of the permuters 406 may access a same check node 404, enabling multi-edge connections to be handled in a single clock cycle. Variable nodes 402 with degrees higher than 4 can be processed accumulating messages over two clock cycles. In another embodiment, a single check node 404 may send c2v messages to four different associated v-nodes 402.

This example decoder design includes inspiration from the flooding decoder. The additional parallelism in the check node 404 to variable node 402 path can allow for processing edges in the check node 404 order as required by the layered decoder schedule. The state memory can be updated check node by check node, and there may be no need for two copies of the complete state memory, as with a flooding decoder. Further, the layered decoder implemented by the described architecture can accommodate multi-edge connections, as discussed in regard to FIG. 3. The described architecture may be configured to implement layered decoding by including a single copy of the state memory and enough storage for updating a single check node at a time. Alternately, an expanded memory could be included, with a copy of the current state and enough memory to update the state of all check nodes, which can enable implementation of a flooding decoder that processes nodes in variable node order, while still providing high parallelism and efficiency.

Figure 5:
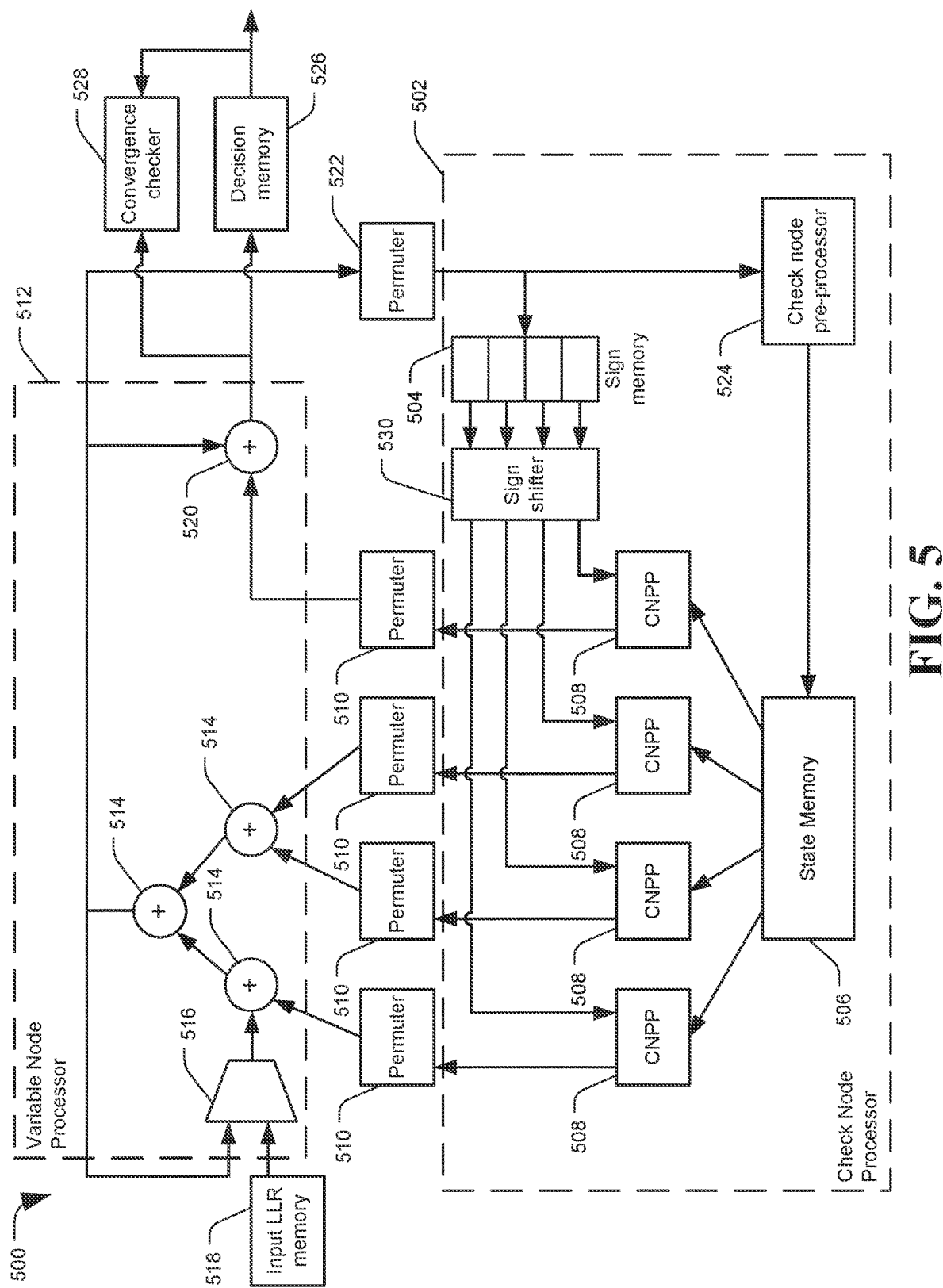
FIG. 5 is a diagram of a system configured to implement a high performance decoder, in accordance with certain embodiments of the present disclosure.

FIG. 5 is a diagram of a system 500 configured to implement a high performance decoder, in accordance with certain embodiments of the present disclosure. In particular, FIG. 5 depicts a more detailed example block diagram architecture of a high efficiency "one-shot" decoder, such as decoder 400 of FIG. 4. The decoder 500 may include a check node processor 502 and a variable node processor 512, connected via a plurality of data paths and permuters 510 and 522. The decoder 500 may further include an input LLR source or memory 518, a decision memory 526 and a convergence checker 528. The components of system 500 may include circuits, software or microcode, or other modules. The system 500 may be configured to process vectors, such that each element can process a vector of, e.g., 512 messages or bits per clock cycle.

The following discussion addresses an example decoder 500 using the assumption that a degree-4 variable node vector is processed at any given time by variable node processor 512. Higher degree variable nodes can be processed by using additional clock cycles, and implications of such higher-degree nodes may be pointed out herein. For convenience, the parallelism of the vector processor (e.g., a number of bits of the total code word associated with each vector message, such as data for 512 code word bits) may be designated "Z". The components of system 500 may operate by exchange LLR value representations for each bit, as discussed previously. The sign memory 504 (and associated sign shifter 530), the decision memory 526, and the convergence checker 528, may be the only parts of the example decoder 500 that use bits (e.g., the sign values representing whether a bit is believed to be a "1" or a "0") rather than LLR values.

In an example embodiment of decoder 500, decoding a code word may involve processing a plurality of v-nodes and c-nodes, and the number of c-nodes a v-node is connected to in a graph (e.g., such as the Tanner graph of FIG. 2) indicates the degree of a v-node. So for example, v-node 0 may be connected to c-nodes 0, 1, 2, and 3, and is therefore degree 4. Different v-nodes can be processed, and different c-nodes can send messages or be updated, on different iterations at the decoder 500. In a layered decoder that processes a graph in the check-node order, the system may first cycle through all v-nodes that share edges with a check node selected for updating.

In an example embodiment, the decoder 500 may be implementing a layered decoder, which may update nodes of a graph in a c-node order, e.g., starting with a c-node selected for updating, such as c-node 0. An edge to a c-node may be updated by a v2c message from the associated v-node. A first edge to c-node 0 may connect to v-node 0, a degree 4 node. Accordingly, the decoder 500 would process v-node 0 at variable node processor 512, and generate c2v messages from all four c-nodes sharing edges with v-node 0 via check node processor 502 (e.g., example c-nodes 0, 1, 2, and 3). The four check nodes may provide c2v messages to v-node 0 in parallel at variable node processor 512, which may calculate and return a v2c message to selected c-node 0 at check node processor 502. The next edge to c-node 0 may connect to a v-node 1, and so variable node processor 512 may be set to process v-node 1, and check node processor 502 may generate c2v messages from all c-nodes having edges with v-node 1. The process may be repeated for each v-node having an edge connection to c-node 0. The system 500 may then shift to updating c-node 1, and repeat the process until all edges for c-node 1 have been updated, etc. The code word may converge at any point once a parity sum has been computed for each check node, without having to fully update all v-nodes for a code word on each iteration, as may be the case with a flooding decoder.

In execution, a variable node may be defined in system 500 based on which check nodes it shares edges with. Accordingly, to "select" a v-node for processing may include sending c2v messages from the four c-nodes that share edges with the selected v-node, which may automatically be processed to generate posterior information and a v2c message. Which check node the v2c message updates may depend on which c2v message was excluded from the calculation of the v2c message based on being passed along the right-most CNPP 508 and permuter 510. The system microcode may control the order in which various check nodes are selected for sending c2v messages, and via which CNPPs 508 and permuters 510, which in turn may control the order of v-node processing and c-node updating.

The c-node processor 502 may include a sign memory 504 and sign shifter 530, a check node pre-processor 524, a state memory 506, and a plurality of check node post-processors (CNPP) 508. The decoder 500 may retain a state in the sign memory 504 and the state memory 506.

The sign memory 504 may contain the sign bits of all the edges or v2c messages in the entire graph. The sign of an edge may be in the form of a bit, either a "0" or a "1", depending on what the v-node 512 believes its corresponding bit to be, based on available LLR and c2v message information. For example, a graph supporting 32k-sized code words with degree-4 variable nodes may have 128k edges, and therefore the sign memory 504 may be large enough to hold 128k bits. In this example, the sign memory 504 may be implemented as four 32k-bit memory banks, such that the system 500 can read four vectors per clock cycle (for the c2v vectors) and write new information (from the v2c vector) into one of the four banks each clock cycle.

The state memory 506 may contain a compressed state of all the parity sums defined by the entire graph (e.g., including the states of all check nodes of a graph for a 32k-bit code word). The compressed state of a check node may consist of the total sign (the sum of all the v2c message sign bits modulus 2 for a given parity sum), the smallest magnitude of v2c messages for a given parity sum ($min_1$), the next smallest magnitude of v2c messages (mine) and the edge index of the graph edge that resulted in the $min_1$ message. The number of words in state memory may equal the maximum number of check node vectors that the decoder 500 can accommodate. In an example embodiment, the state for each check node may be about 20 bits wide. A Z=512 vector processor 500 with a maximum of five check node vectors can use a state memory 506 with five words of 20*512=10240 bits width, where each word holds the state of a c-node vector. The state memory 506 address may be provided by a micro code memory of the decoder 500. The micro code memory may be, e.g., part of and managed by controller 106 of FIG. 1, or a component of decoder 500. Although a state memory 506 for a layered decoder may include only a single state for each check node, a flooding decoder implementation may include an expanded state memory 506 capable of storing a "current" state as well as an "updating" state for each check node, where the "updating" state may replace the current state once all variable nodes have been processed.

The one or more check node post-processors 508 may generate all four c2v message vectors for a given variable node in parallel. The parallel message vectors can come from different check node vectors (e.g., four check node states currently being used to generate c2v messages by the check node processor 502), or multiple message vectors can come from a single check node vector (e.g., in the case of a multi-edge connection between a c-node and v-node), or a combination thereof. The sign information for a given c2v message may be obtained by subtracting edge-specific sign bit vectors (from the sign memory 504) from the total sign bit information stored in the state memory 506 for a given check node. The magnitude of the output messages may be given by $min_1$ unless the edge index of an outgoing message matches the stored edge index of $min_1$ in this case the magnitude may be set to mine. The four c2v message vectors may be sent to four programmable permuters 510. A permuter 510 or 522 can receive individual control values from the micro code memory to rearrange or re-order the elements of a message vector, such that the order of elements or messages in each message vector is different between the input and output ports of the permuter.

The variable node processor 512 may receive the four permuted message vectors in parallel, along with input LLR data from the LLR memory or detector 518, which enables the variable node processor 512 to calculate both posterior and v2c messages in parallel. When a read or data decode is first initiated, the state and sign values at the check node processor 502 and sent via the first c2v messages may be set to zero or similar null values, so the initial v2c message may be essentially based on the LLR data alone, whereas relevant information from check nodes may be used in calculation of the posterior information and v2c messages once the check node states have been updated. If the variable node receives c2v messages on multiple cycles (e.g., if the v-node has a degree is greater than 4), then a variable node degree mux (multiplexer) 516 can convert the adder tree (of adder nodes or modules 514) to an accumulator, which can add data from additional c2v messages during a second or subsequent clock cycle.

The variable node processor 512 may generate one v2c message vector per clock cycle. The magnitude of the messages may be saturated to reduce the width of the data path, since saturation may have minimal impact on the decoder 500 performance as all messages and the input LLR values 518 may be saturated with identical limits. The v2c message vector may be generated based on the leftmost adders 514, and may not include information from the rightmost adder 520 which received a c2v message from the rightmost of the c-node permuters 510. The v2c message may be permuted, at v-node permuter 522, inverse relative to the non-included rightmost permuter 510, and sent to the check node processor 502 for calculating the next state of the current check node. The "current" or "selected" check node may refer to the check node for which the v2c message was updating an edge, and may be the same check node that corresponded to the c2v message sent via the right-most check node permuter 510 that was not incorporated into the v2c message.

After the v2c message vector passes permuter 522, the sign bits of the inverse permuted v2c message vector may be stored in the sign memory 504 for the current check node. The check node pre-processor 524 may maintain a partial state for the current check node, based on the v2c messages received for the current check node since its state was last updated at the state memory 506. The check node pre-processor 423 may update the partial state using a read-modify-write operation. The partial state may be initialized as total sign='0', min1 & min2=maximum reliability. As each v2c message is received, the partial state may be read. The sign bit may be XOR with the total sign. The message magnitude may be compared with the current $min_1$ & min2 values which are updated (including edge index 1) as necessary if the message magnitude is smaller the either or both of the min1 & mint values. The partial state may become the new check node state once v2c messages for all edges of the check node have been received. The check node pre-processor 524 may send the updated state for the current check node to the state memory 506. The check node pre-processor 524 may contain a memory large enough to hold the partial state of a single check node, which may be the selected check node currently being updated.

As discussed above, the v2c message for edge i, as sent through permuter 522, may exclude the c2v message for the same edge. As shown in FIG. 5, the message vector from the right-most check node post processor 508 may not be included in the calculation of the v2c message at adders 514, and may instead be sent to adder 520. In the depicted example architecture, the c2v message for edge i should thus be generated by the right-most post-processor 508, which can be accomplished by using the sign shifter 530 to shift the sign information from the sign memory 504, and also shifting the node index for the four post-processors 508.

At adder 520, the c2v message vector for edge i may be combined with the v2c message for edge i to generate the posterior information for the current variable node at variable node processor 512. The sign bits of the posterior information (e.g., one sign bit for each of the Z bits of the vector) may be sent to a decision memory 526 and a fast convergence checker 528. The checker 528 can detect convergence as soon as a valid code word has been written into the decision memory 526.

An example process flow for reading data from a memory may proceed as follows. The check node post-processors 508 may generate c2v messages based on the state from the state memory 506 and sign information from the sign memory 504 via the sign shifter 530. The sign bits of the output from a check node post-processor 508 may depend on the signs from all the v2c messages received at that check node, except for the signs of the message on the path or edge for which a message is being generated. The check node post-processor 508 may take the total sign value for the relevant check node stored in the state memory 506, and remove the signs, stored in the sign memory 504, from the v2c message that was received along the edge for which a message is being generated. As the system iterates, the sign shifter 530 may shift which check node corresponds to which check node post-processor 508 by shifting which signs are provided to each from the sign shifter 504.

The four c2v message vectors may be sent to the left four permuters 510, which may perform pre-determined permutations on the message vectors, and send the resultant messages to the adders 514 and 520. The three left-most adders 514 may add the input LLR value from the LLR memory or detector 518 to the c2v messages to create a return v2c message. If the variable node will receive c2v inputs over two cycles (e.g., if it is greater than degree 4), the output of the adders 514 may be sent to a multiplexor 516, so that the value can be added to any c2v messages received at adders 514 on the next cycle, therefore operating as an accumulator. At most three additional c2v message vectors can be sent during a second cycle or subsequent cycle, due to the special handling of the rightmost c2v path resulting in that path not being added to the v2c message.

At a first iteration, there may be no valid information in the state memory 506 or sign memory 504, so all the generated c2v messages may be set to 0. Therefore, the adders 514 may simply combine 0 vectors with the LLR input, and therefore the initial v2c return message essentially comprises the LLR input symbols. Accordingly, the v2c and c2v messages may comprise LLR reliability information, indicating whether the bit is believed to be a 0 or a 1, and how reliable that estimate is. The sign of the value may indicate an estimate on the bit, with positive values corresponding to a "0" bit value, and negative values corresponding to a "1" bit value (or vice-versa, depending on implementation), and the magnitude indicating confidence.

Accordingly, the sign memory 504 and state memory 506 may track bit estimates and confidence indicators for nodes and edges. When the sign bits of all the edge values for a c-node are XOR'd together, and produce a "0", the state may indicate how confident the determination is that the node converged. The check node processor 502 may process the sign bit and the reliability information (message magnitude) separately. The additional state information (e.g., min1, min2 and edge index 1) may be used to estimate the reliability of the c2v messages, whereas the sign bit of the c2v message may be calculated by an XOR of the total sign (e.g., the XOR of all sign bits of v2c messages for a given check node) and the sign bit of the v2c message received on the same edge as the edge for which the c2v message is being calculated.

The output of the three left-most adders 514 may be combined with the right-most c2v message vector at the right adder 520. The input c2v messages and the input LLR symbol from LLR memory 518 may make up the total information for the particular bits of the variable node vector of variable node processor 512. The sign bit information may be provided to decision memory 526 and convergence checker 528, while the reliability information may be discarded.

The return v2c message, from the three left-most adders 514, may not use the message vector from the current check node being updated, which may be received from the right-most CNPP 508 and permuter 510. The return v2c message may be permuted at permuter 522, with the sign bits stored to sign memory 504, and the check node pre-processor 524 may use the v2c message to update the state for the relevant check node, for example in an internal memory of the pre-processor 524 configured to store state information for the selected check node. When the pre-processor 524 has finished processing or updating all v2c messages (e.g., all edges) for the selected check node, it may update the state for that check node at the state memory 506. If convergence of the code word hasn't been determined at the convergence checker 528, the system may continue iterating, with updated check node states being used to generate further c2v messages. An example fast convergence checker 528 is described in regard to FIG. 6.

Figure 6:
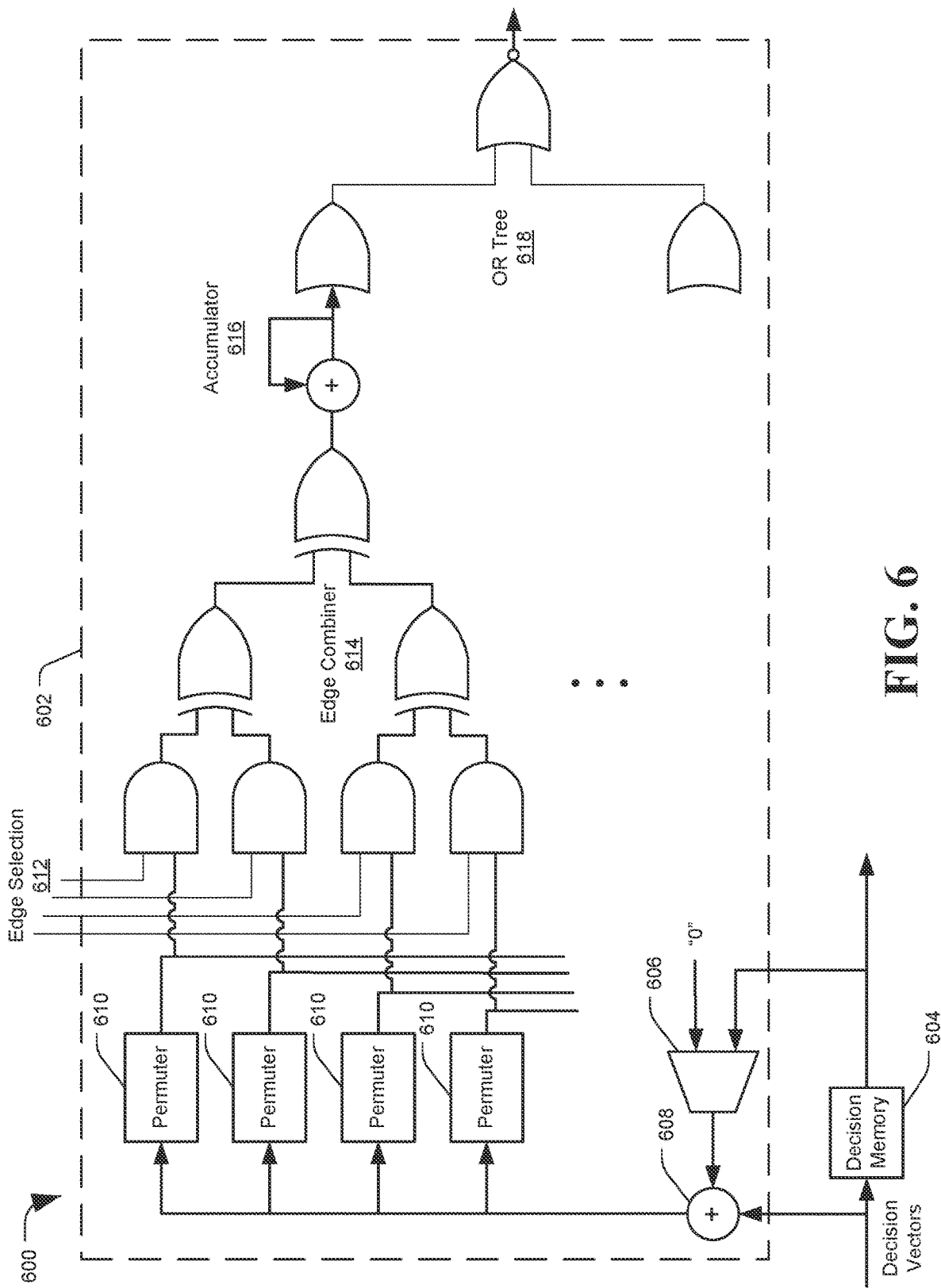
FIG. 6 is a diagram of a system configured to implement a high performance decoder, in accordance with certain embodiments of the present disclosure.

FIG. 6 is a diagram of a system 600 configured to implement a high performance decoder, in accordance with certain embodiments of the present disclosure. In particular, FIG. 6 depicts an example fast convergence checker 602 and a decision memory 604, such as fast convergence checker 528 and decision memory 526 of FIG. 5, respectively. The fast convergence checker 602 may include an initialization multiplexor (MUX) 606, an adder 608, a plurality of permuters 610, an edge selection module 612, an edge combiner module 614, an accumulator 616, and an OR tree 618.

Some convergence checker designs may use a parity accumulator for each active check node. The accumulator can be reset at the beginning of each iteration and updated with permuted sign bits from the posterior information. If all active parity accumulators contain all-zero vectors at the end of the iteration, then the decoder has converged.

The proposed "one-shot" decoder instead may contain a fast convergence checker 602 as depicted in system 600. This checker 602 can detect convergence at any time after all input data has been read, which is usually a fraction of the first iteration. For example, if the input data (LLR values) is correct (e.g., the LLR estimates of the bit values contain no errors) then the c2v data may be irrelevant for the convergence decision. If the first check node is connected to all the variable nodes, then the decoder can converge at the end of processing of the first check node during the first iteration, even if no information has been sent from the check node to the variable nodes.

The convergence checker 602 can receive decision vectors from the variable node processors. The decision vector of a variable node vector may include the sign bits of the posterior information for the codeword bits of the variable node vector (e.g., 512 bits), and the reliability LLR information may be discarded. The decision vectors may be stored in the decision memory 604.

A modulus 2 vector adder 608 may be used to detect bits that have changed between new and previous decision vectors for a given variable node vector by adding the new vector and the previous vector, via MUX 606, obtained from the decision memory 604. The result may be a vector where a '1' bit indicates a bit that has changed. As a result, the state of the convergence checker 602 does not have to be reset at the beginning of each iteration; the state may always be valid after decision vectors from all variable nodes have been received.

The initial decision vector from a given variable node vector may be added to an all-zero's vector, via the initialization multiplexor 606, such that it is passed unchanged to the permuters 610. The initialization may only occur at the beginning of the decode.

In the depicted example embodiment, four permuters 610 may be used in parallel to provide all message vectors from a degree 4 variable node to the parity accumulators 616. Higher degree variable nodes may be accommodated during an additional clock cycle. The convergence checker permuters 610 may implement a parallel version of the sign bits of the v2c path. The variable node may send a single v2c message vector whenever a check node is connected to that variable node. The convergence permuters 610 can generate all four sign bit vectors in parallel rather than sequentially. This parallel processing can allow the convergence to be detected before the complete check node state has been updated.

There may be one parity accumulator 616 (and an associated edge selection module 612 and edge combiner 614) for each active check node in the graph. The number of permuters 610 may not correlate to the number of check nodes (e.g., it may be four or otherwise correspond to a number of c2v paths in the decoder for simplicity, as there may be four permuter commands from each micro code instruction), and the permuters 610 may be shared among all the accumulators 616. Maximum flexibility in connecting vectors from a given permuter 610 to an accumulator 616 may be achieved by using a AND-XOR network edge combiner 614 enabled by edge selection lines 612, which may be controlled by the decoder micro code. This design allows for multi-edges where two or more vector edges (with different permutation values) connect a variable node to a check node.

The combined edge vectors may be accumulated in one vector accumulator 616 per check node. An OR tree may be used to check for convergence, which may be detected when all active accumulators 616 contain all-zero's vectors. Example methods of applying a high-performance decoder as described herein are addressed in the following figures.

Figure 7:
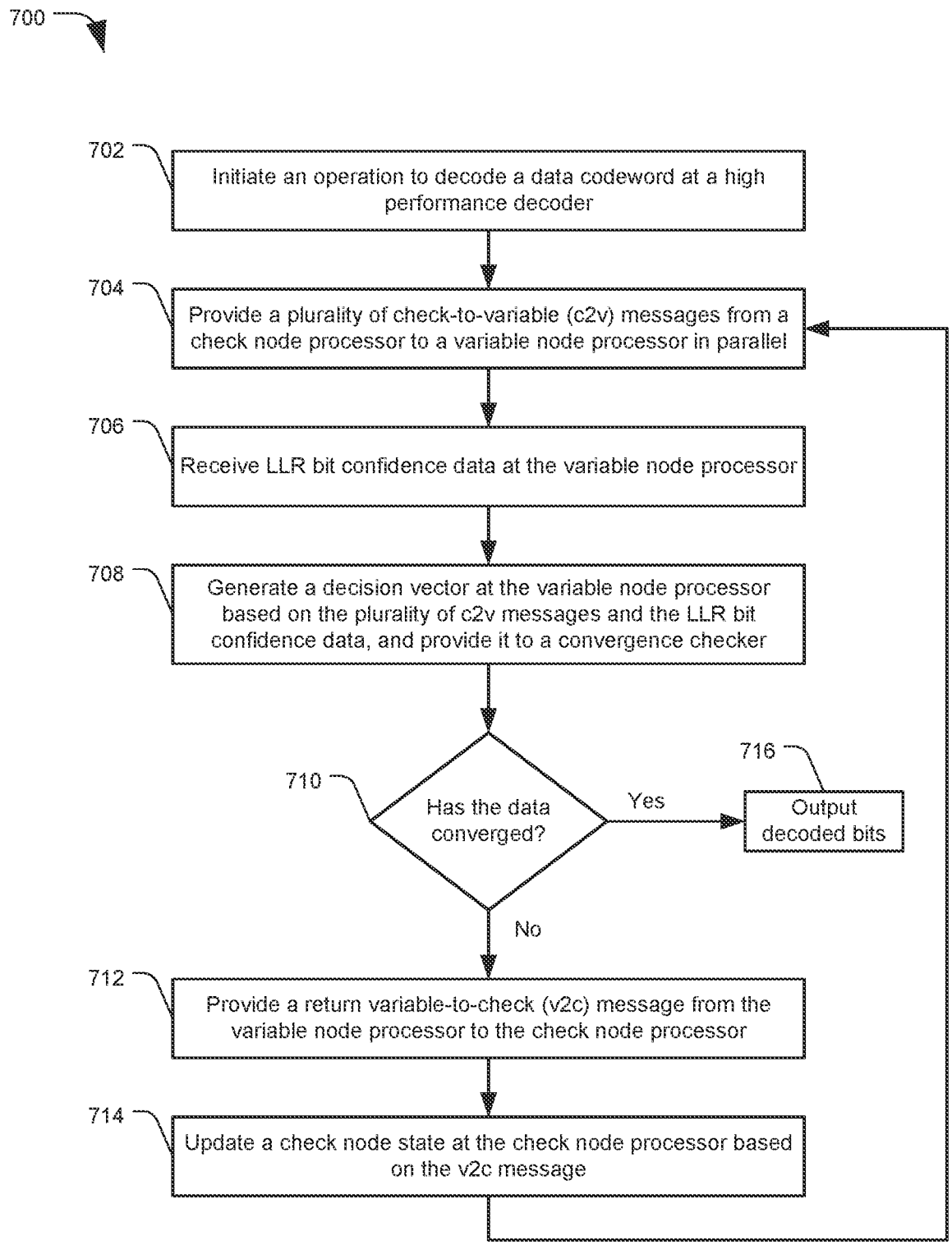
FIG. 7 depicts a flowchart of an example method for implementing a high performance decoder, in accordance with certain embodiments of the present disclosure.

FIG. 7 depicts a flowchart 700 of an example method for implementing a high performance decoder, in accordance with certain embodiments of the present disclosure. In particular, the method may include an example process for applying a decoder, such as a low-density parity check (LDPC) decoder, having high parallelism and low latency. The method may be performed by devices and systems described herein, such as the storage drive of FIG. 1, and the decoder and convergence checker of FIGS. 4, 5, and 6.

The method may include initiating an operation to decode a data codeword at a high performance decoder, at 702. For example, the decoding operation may include a data read operation from a solid state memory device as depicted in FIG. 1, although the disclosure is not limited to such applications. The decoding operation may include LDPC decoding operations based on log likelihood ratio (LLR) confidence values and graphs of variable nodes (v-nodes) and check nodes or constraint nodes (c-nodes), which may be executed via v-node processors and c-node processors. Rather than v- or c-nodes to handle individual bits, the method may include processing v- and c-node vectors, which may include large numbers of bits of a codeword grouped together.

The method may include providing a plurality of check-to-variable (c2v) messages from a check node processor to a variable node processor in parallel. As depicted in FIGS. 4 and 5, c2v messages may be sent along multiple parallel busses or paths from a c-node processor to a v-node processor in a single clock cycle. Depending on implementation, the parallel c2v message architecture could be used to implement layered or flooding decoders, to process nodes in a check node-first or variable node-first order, respectively. In an example embodiment, the check node processor may send four c2v messages simultaneously (e.g., during a same clock cycle), each from a check node that shares one or more decoder graph edges with a same variable node. So for a degree-4 variable node, the variable node processor may use the four c2v messages to process all edges for the v-node in a single clock cycle. In some embodiments, a variable node having a higher degree than the number of c2v message busses or paths may utilize two or more clock cycles to send additional c2v messages.

At 706, the method may include receiving LLR bit confidence data at the variable node processor. A detector or LLR memory may provide confidence data corresponding to a bit or bits of a variable node or variable node vector being processed by the variable node processor. Based on the bit confidence data and the plurality of c2v messages received by the variable node processor, the method may include generating a decision vector and providing it to a convergence detector, at 708.

A determination may be made whether the codeword has converged, at 710. If yes, the valid bits of the codeword may be determined and output, and the method may end, at 716. If the codeword hasn't converged, decoding may continue with the variable node processor providing a return variable-to-check (v2c) message to the check not processor, at 712. The v2c message may be generated based on the LLR bit confidence data and at least one of the plurality of c2v messages. For example, the v2c message may not be based on a c2v corresponding to a same graph edge being updated by the v2c message.

At 714, the method may include updating a check node state at the check node processor based on the v2c message. In an example embodiment where the check node processor sends c2v messages from multiple check nodes and receives a single v2c reply or return message, the check node processor may update only a single check node of interest. The method may then return to 704, including providing a next plurality of c2v messages, and repeat until the codeword converges, or in some examples, until the decode operation fails or times out. On different iterations, the check nodes to which the c2v messages correspond may change, and the permuters between the check node processor and variable node processor may be adjusted to alter information sent between the node vectors.

Figure 8:
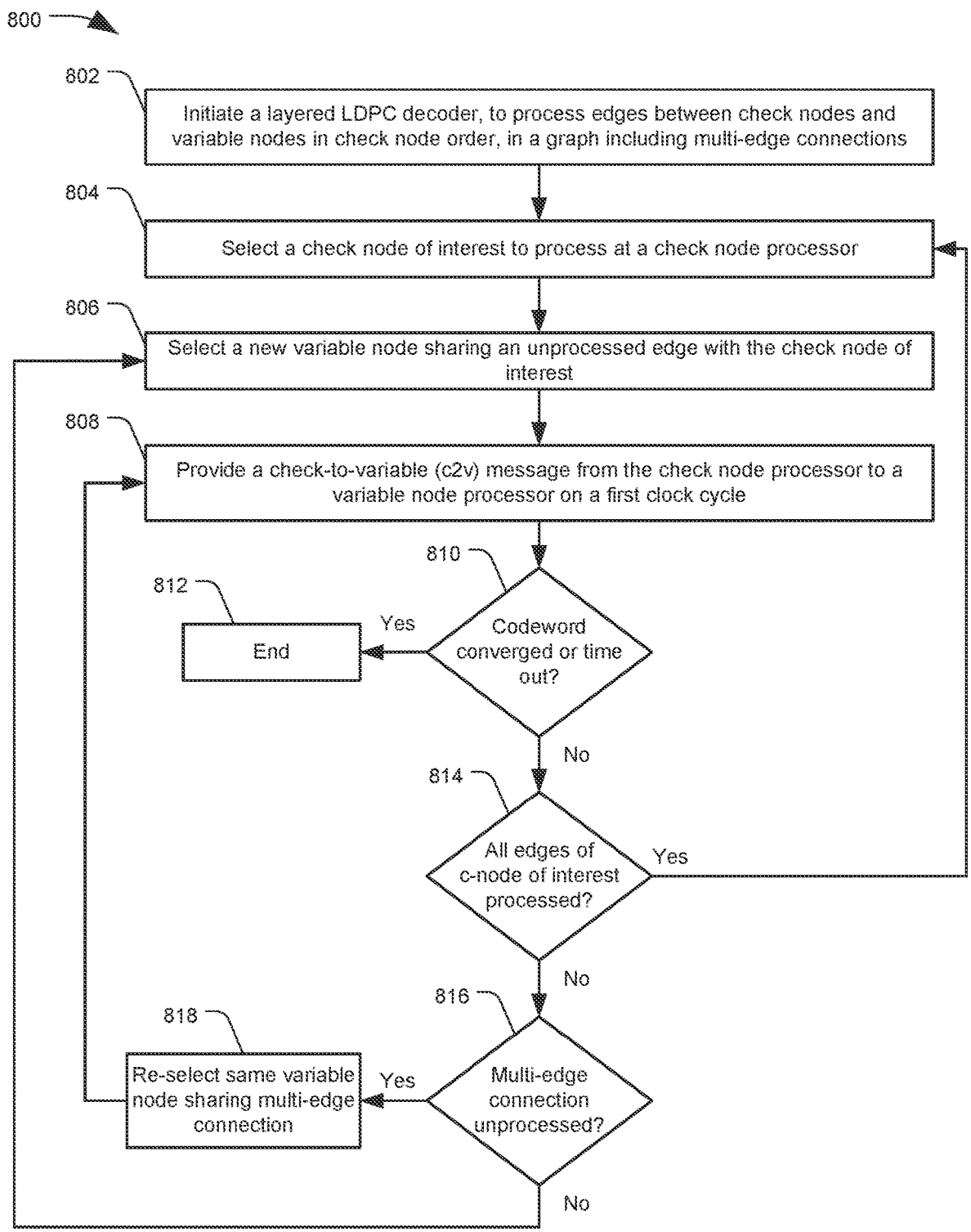
FIG. 8 depicts a flowchart of an example method for implementing a high performance decoder, in accordance with certain embodiments of the present disclosure.

FIG. 8 depicts a flowchart 800 of an example method for implementing a high performance decoder, in accordance with certain embodiments of the present disclosure. In particular, flowchart 800 describes the application of an example "one-shot" layered decoder having multi-edge connections. The method may be performed by devices and systems described herein, such as the storage drive of FIG. 1, and the decoder and convergence checker of FIGS. 5 and 6.

The method may include initiating a layered low-density parity check (LDPC) decoder, to process edges between check nodes and variable nodes in check node order, in a graph including multi-edge connections, as discussed in regard to FIG. 3. Multi-edge connections may include decoder graph configurations in which there may be a plurality of different edge connections between a check node vector and a variable node vector, and where the different edges may be implemented by or represent different permuter settings.

At 804, the method may include selecting a check node of interest to process or update at a check node processor. A layered decoder may process edges of a decoder graph in check node order, meaning all edges coming into a selected check node from variable nodes are processed first, before moving on to a second check node, and so on. The check node of interest selected at 804 may be a check node selected to have all of its edges processed before moving on to a next check node.

A variable node sharing an unprocessed edge with the check node of interest may be selected, at 806. As each edge for the check node of interest is processed, a variable node associated with the next unprocessed edge of the check node may be selected on future iterations of the decoder. When there are multi-edge connections between a check node and a variable node, the same variable node may be processed for multiple iterations in a row to update each of the multiple edge connections. The order of processing check nodes and variable nodes may be managed by micro code for the decoder that controls the order in which edges and their associated c2v messages are sent to a variable node processor. The variable node may be "selected" based on which combination of edges are selected for the c2v messages during any given iteration of the decoder.

The method may include providing a check-to-variable (c2v) message from the check node processor to a variable node processor on a first clock cycle, at 808. In some examples, multiple c2v messages may be sent in parallel (e.g., during a single clock cycle along multiple busses or paths). The c2v messages may be from one or more check nodes sharing an edge with the selected variable node, such as from multiple different check nodes, from the same check node along different edges of a multi-edge connection, or a combination thereof.

At 810, the method may include determining whether the codeword being decoded has converged, or alternately whether the decoding process has failed or timed out. The convergence determination may be made based on one or more decision vectors generated by the variable node processor based on received c2v messages and LLR bit confidence data. Convergence may be detected at any point after all input LLR values have been received for the codeword. If the codeword has converged, the method may end, at 812, including outputting a decoded data codeword. Alternately, if the decoding operation failed or timed out, the method may still end at 812, and an error message or indicator may be sent.

If the codeword has not converged, at 810, the method may include determining whether all edges of the check of interest have been processed, at 814. If so, the method may include returning to 804, and selecting a next check node of interest to process at the check node processor. Selecting a check node of interest may again be based on micro code controlling which edges and associated c2v messages are to be sent to the variable node processor during any given iteration, and potentially along which busses or message paths. Referring to the example embodiment in FIG. 5, the c2v message being sent via the right-most check node post-processor 598 and permuter 510 may correspond to the check node of interest. The micro code may be configured to schedule the c2v messages being sent, and along which paths, to implement a check node-ordered layered decoding scheme that processes all edges for one check node at a time until all check nodes have been updated. From 804, the method may repeat until the codeword has converged, or until the operation fails or times out.

If all edges of the check node of interest have not been processed, at 814, the method may include determining whether a multi-edge connection with the currently selected variable node remains unprocessed, at 816. If so, the method may include re-selecting the same variable node, at 818, and providing it with the next one or more c2v messages, at 808. Accordingly, in some embodiments multiple c2v message vectors can be sent between a selected check node and a selected variable node in parallel for a multi-edge connection, but only a single edge from the variable node to the check node can be updated in a single iteration or cycle. In such embodiments, to fully update a check node may include multiple iterations between the same check node and variable node to update all edges of the multi-edge connection.

However, if a multi-edge connection with the current variable node does not remain unprocessed, at 816, the method may include selecting a new variable node, at 806, and continuing the process until the code word converges or the decoding process fails or times out, at 812.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above embodiments, and other embodiments not specifically described herein, will be apparent to those of skill in the art upon reviewing the description. Steps depicted in the flowcharts may optionally be excluded, added, performed in a different order, or performed with different degrees of concurrency than shown (e.g., steps depicted as sequential may be performed concurrently). Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. An apparatus comprising:
a decoder circuit configured to decode a codeword of bits by implementing a layered decoder to update a graph of check nodes and variable nodes in check node order, including:
a check node processor configured to provide a plurality of check to variable (c2v) message vectors to a variable node processor in parallel, each of the plurality of c2v message vectors including log likelihood ratio (LLR) data related to a parity sum of multiple bits of the codeword;
the variable node processor configured to generate a decision vector based on the plurality of c2v message vectors;
a convergence checker circuit configured to:
determine whether the codeword has been decoded based on the decision vector; and
output decoded data when the codeword has been decoded.

2. The apparatus of claim 1 further comprising:
the decoder circuit including a low density parity check (LDPC) circuit configured to decode the codeword based on the graph including:
a plurality of variable nodes, each configured to determine a bit value and confidence value for a corresponding bit of the codeword;
a plurality of check nodes, each configured to determine a parity sum for a selected subset of bits of the codeword;
a plurality of edges connecting selected variable nodes and selected check nodes; and
the decoder circuit configured to process the graph via the variable node processor and the check node processor.

3. The apparatus of claim 2 further comprising:
the variable node processor further configured to:
receive input data related to a selected set of bits of the codeword, the input data indicating a confidence of the selected set of bits as initially read;
generate a single variable to check (v2c) message vector based on a subset of the plurality of c2v message vectors and the input data, the v2c message vector including LLR data related to the selected set of bits; and
provide the v2c message vector to the check node processor.

4. The apparatus of claim 3 further comprising:
the check node processor further configured to update a selected check node based on the v2c message vector.

5. The apparatus of claim 4 further comprising:
the v2c message vector corresponds to a selected edge between the selected check node and a selected variable node currently being actively processed by the variable node processor;
the check node processor is configured to update the selected check node, including:
store data from the v2c message vector;
update a state of the selected check node when v2c message vectors corresponding to all edges of the selected check node have been received; and
generate a future c2v message vector from the selected check node based on the updated state.

6. The apparatus of claim 5 further comprising:
the decoder circuit configured to implement the layered decoder to update the graph in a check node order by updating every edge of a given check node before updating a next check node.

7. The apparatus of claim 6 further comprising:
the decoder circuit includes a plurality of data paths between the check node processor and the variable node processor, the plurality of data paths configured to transmit the plurality of c2v message vectors in parallel;
the variable node processor is configured to:
not include a selected one of the plurality of data paths from contributing to generation of the v2c message vector;
include the selected one of the plurality of data paths in contributing to generation of the decision vector; and
the selected one of the plurality of data paths corresponds to the selected edge to be updated by the v2c message vector.

8. The apparatus of claim 7 further comprising:
the decoder circuit is configured to process message vectors corresponding to data for Z bits of the codeword, including c2v message vectors and v2c message vectors each including data for Z bits.

9. The apparatus of claim 8 further comprising:
the plurality of data paths include a corresponding plurality of permuter circuits, the permuter circuits configured to modify an order of the data for the Z bits within a message vector.

10. The apparatus of claim 9 further comprising:
the graph includes a multi-edge connection between a first check node and a first variable node; and
the plurality of c2v message vectors include multiple messages from the first check node to the first variable node corresponding to different edges of the multi-edge connection.

11. The apparatus of claim 3 further comprising:
the convergence checker circuit is further configured to determine whether the codeword has been decoded as earlier as input data is received at the decoding circuit for each bit of the codeword, priority to parity sums being determined for each check node of the graph.

12. A method comprising:
implementing a layered decoder to decode a codeword of bits via a decoder circuit by updating a graph of check nodes and variable nodes in check node order, including:
providing a plurality of check to variable (c2v) messages from a check node processor to a variable node processor in parallel, the plurality of c2v messages including log likelihood ratio (LLR) data related to a parity sum of multiple bits of the codeword;
generating a decision vector based on the plurality of c2v messages;
determining whether the codeword has been decoded based on the decision vector; and
outputting decoded data when the codeword has been decoded.

13. The method of claim 12 further comprising:
decoding the codeword via a low density parity check (LDPC) decoder circuit based on the graph including:
a plurality of variable nodes, each configured to determine a bit value and confidence value for a corresponding bit of the codeword;
a plurality of check nodes, each configured to determine a parity sum for a selected subset of bits of the codeword;

a plurality of edges connecting selected variable nodes and selected check nodes; and processing the graph via the variable node processor and the check node processor.

14. The method of claim 13 further comprising:

receiving input data related to a selected bit of the codeword, the input data indicating a confidence of the selected bit as initially read;

generating a single variable to check (v2c) message based on a subset of the plurality of c2v messages and the input data, the v2c message including LLR data related to the selected bit and corresponding to a selected edge between a selected check node and a selected variable node currently being actively processed by the variable node processor;

providing the v2c message from the variable node processor to the check node processor;

updating the selected check node based on the v2c message, including:

storing data from the v2c message;

updating a state of the selected check node when v2c messages corresponding to all edges of the selected check node have been received; and generating a future c2v message from the selected check node based on the updated state.

15. The method of claim 14 further comprising:

decoding the codeword by processing message vectors corresponding to data for Z bits of the codeword, including c2v messages and v2c messages each including data for Z bits;

modifying an order of the data for the Z bits within a message vector via a plurality of permuter circuits on a plurality of data paths used to transmit the plurality c2v messages between the check node processor and the variable node processor;

not including a selected one of the plurality of data paths from contributing to generation of the v2c message, wherein the selected one of the plurality of data paths corresponds to the selected edge to be updated by the v2c message; and including the selected one of the plurality of data paths in contributing to generation of the decision vector.

16. The method of claim 13 further comprising:

implementing the layered decoder via the decoder circuit to update the graph in a check node order includes updating every edge of a given check node before updating a next check node;

including a multi-edge connection between a first check node and a first variable node in the graph; and including, in the plurality of c2v messages, multiple messages from the first check node to the first variable node corresponding to different edges of the multi-edge connection.

17. A memory device storing instructions that, when executed, cause a processor to perform a method comprising:

implementing a layered decoder to decode a codeword of bits via a decoder circuit by updating a graph of check nodes and variable nodes in check node order, including:

providing a plurality of check to variable (c2v) message vectors from a check node processor to a variable node processor in parallel, each of the plurality of c2v message vectors including log likelihood ratio (LLR) data related to a parity sum of multiple bits of the codeword;

generating a decision vector based on the plurality of c2v message vectors;

determining whether the codeword has been decoded based on the decision vector; and outputting decoded data when the codeword has been decoded.

18. The memory device of claim 17 storing instructions that, when executed, cause the processor to perform the method further comprising:

decoding the codeword via a low density parity check (LDPC) decoder circuit based on a graph including:

a plurality of variable nodes, each configured to determine a bit value and confidence value for a corresponding bit of the codeword;

a plurality of check nodes, each configured to determine a parity sum for a selected subset of bits of the codeword;

a plurality of edges connecting selected variable nodes and selected check nodes; and processing the graph via the variable node processor and the check node processor.

19. The memory device of claim 18 storing instructions that, when executed, cause the processor to perform the method further comprising:

receiving input data related to a selected bit of the codeword, the input data indicating a confidence of the selected bit as initially read;

generating a single variable to check (v2c) message vector based on a subset of the plurality of c2v message vectors and the input data, the v2c message vector including LLR data related to the selected bit and corresponding to a selected edge between a selected check node and a selected variable node currently being actively processed by the variable node processor;

providing the v2c message vector from the variable node processor to the check node processor;

updating the selected check node based on the v2c message vector, including:

storing data from the v2c message vector;

updating a state of the selected check node when v2c message vectors corresponding to all edges of the selected check node have been received; and generating a future c2v message vector from the selected check node based on the updated state.

20. The memory device of claim 18 storing instructions that, when executed, cause the processor to perform the method further comprising:

implementing the layered decoder via the decoder circuit to update the graph in a check node order includes updating every edge of a given check node before updating a next check node;

including a multi-edge connection between a first check node and a first variable node in the graph; and including, in the plurality of c2v message vectors, multiple messages from the first check node to the first variable node corresponding to different edges of the multi-edge connection.

* * * * *